US007304860B2

(12) United States Patent
Tsai

(10) Patent No.: US 7,304,860 B2
(45) **Date of Patent: *Dec. 4, 2007**

(54) PRINTED CIRCUIT BOARD WITH THIN FILM SWITCHES FOR A KEYBOARD

(76) Inventor: Huo-Lu Tsai, No. 188-1, Jhongjheng Rd., Shangfeng Village, Daya Hsiang, Taichung Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/333,688

(22) Filed: Jan. 17, 2006

(65) Prior Publication Data

US 2007/0163866 A1 Jul. 19, 2007

(51) Int. Cl.
*H05K 7/02* (2006.01)
*H05K 7/06* (2006.01)
*H05K 7/08* (2006.01)
*H05K 7/10* (2006.01)

(52) U.S. Cl. ...................... 361/760; 361/795; 174/262; 200/511; 200/512

(58) Field of Classification Search ........ 174/260-264; 361/792-795; 200/511-512
See application file for complete search history.

(56) References Cited

U.S. PATENT DOCUMENTS 4,249,044 A * 2/1981 Larson ...................... 200/5 A
5,786,986 A * 7/1998 Bregman et al. ........... 361/719
5,895,900 A * 4/1999 Okada et al. ............. 200/85 R
6,388,208 B1 * 5/2002 Kiani et al. ................. 174/266
6,614,663 B1 * 9/2003 Yokota et al. .............. 361/780

* cited by examiner

*Primary Examiner*—Tuan T. Dinh
(74) *Attorney, Agent, or Firm*—Alan Kamrath; Kamrath & Associates P.A.

(57) ABSTRACT

A printed circuit board with thin film switches for a keyboard including an upper board having multiple circuit lines, an insulating separation defining multiple through holes, a lower board having multiple circuit lines and multiple thin film switches mounted on the upper and lower boards. The thin film switch has two thin film conductive elements respectively formed on the upper and lower boards and correspond to one of the through holes in the insulating separation. Each thin film conductive element has a center conductor, at least two outer conductors formed adjacent to the center conductor, and at least two conductive lines connected to the center and outer conductors. With such an arrangement, the areas of the center and outer conductors will be reduced, surfaces of the conductors are even in the curing procedure of fabricating upper or lower board to keep a stable touching sensitivity.

3 Claims, 2 Drawing Sheets

PRINTED CIRCUIT BOARD WITH THIN FILM SWITCHES FOR A KEYBOARD

BACKGROUND OF THE INVENTION

1. Field of the Invention

The present invention relates to a printed circuit board (PCB) with thin film switches for a keyboard and, more particularly, to a PCB with thin film switches for a keyboard and having a stable touching sensitivity.

2. Description of Related Art

A keyboard includes a base having an upper opening, a top cover, a printed circuit board (PCB), and multiple keys. The multiple keys are mounted on the top cover, and the top cover is mounted over the upper opening of the base. The PCB is mounted in the base and has multiple thin film switches corresponding to the multiple keys on the top cover. Therefore, when one key is pressed, the pressed key will touch the corresponding thin film switch on the PCB, and then the PCB will output an electronic signal to a computer connected to the keyboard.

With reference to FIG. 2, a conventional dual-layer PCB of the keyboard has an upper board (10), an insulating separation (30), a lower board (20) and multiple thin film switches. The lower surface (101) of the upper board (10) and the upper surface (201) of the lower board (20) respectively have multiple circuit lines (12, 13) (22, 23). The insulating separation (30) is positioned between the upper and lower boards (10, 20) and defines multiple through holes (31). The upper surface (301) of the insulating separation (30) abuts with the lower surface (101), and the lower surface (302) of the insulating separation (30) abuts with the upper surface (201).

The multiple thin film switches are mounted between the upper board (10) and the lower board (20), but only one thin film switch is shown in FIG. 2. Each thin film switch includes two thin conductive elements (40, 50) respectively formed on the upper and lower boards (10, 20). The two thin conductive elements (40, 50) are aligned with one of the through holes (31), and each is formed as a metal sheet. The two thin conductive elements (40, 50) are respectively connected to the circuit lines (12, 13) (22, 23).

The two thin conductive elements (40, 50) are separated by the insulating separation (30) and aligned with the corresponding through hole (31). When one key on the top cover of the keyboard is pressed, the two conductive elements (40, 50) corresponding to the pressed key touches with each other and are connected electronically through the aligning through hole (31) of the insulating separation (30). When the pressed force applied onto the key is released, the two thin conductive elements (40, 50) are disconnected electronically.

Since the thin conductive elements (40, 50) are formed on the upper and lower boards (10, 20), exposure surfaces of the thin conductive elements (40, 50) are easily shrunk to form to an uneven face in a curing procedure of fabricating the upper or lower board (10, 20). Thus, the uneven faces decrease a touching area between the thin conductive elements (40, 50) to make the touching sensitivity of the thin film switch not stable.

Therefore, the present invention provides a new printed circuit board with thin film switches of a keyboard to overcome the drawback of the conventional thin film switch.

SUMMARY OF THE INVENTION

The main objective of the present invention is to provide a printed circuit board (PCB) with thin film switches for a keyboard and having a stable touching sensitivity.

The PCB has an upper and a lower boards, an insulating separation positioned between the upper and lower boards and defining multiple holes, and multiple thin film switches mounted on the upper and lower boards. Each thin film switch has two thin film conductive elements formed respectively on the upper and lower boards and corresponding to one of the through holes in the insulating separation. Each thin film conductive element has a center conductor, at least two outer conductors formed next to the center conductor, and at least two conductive lines connected to the center and outer conductors.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
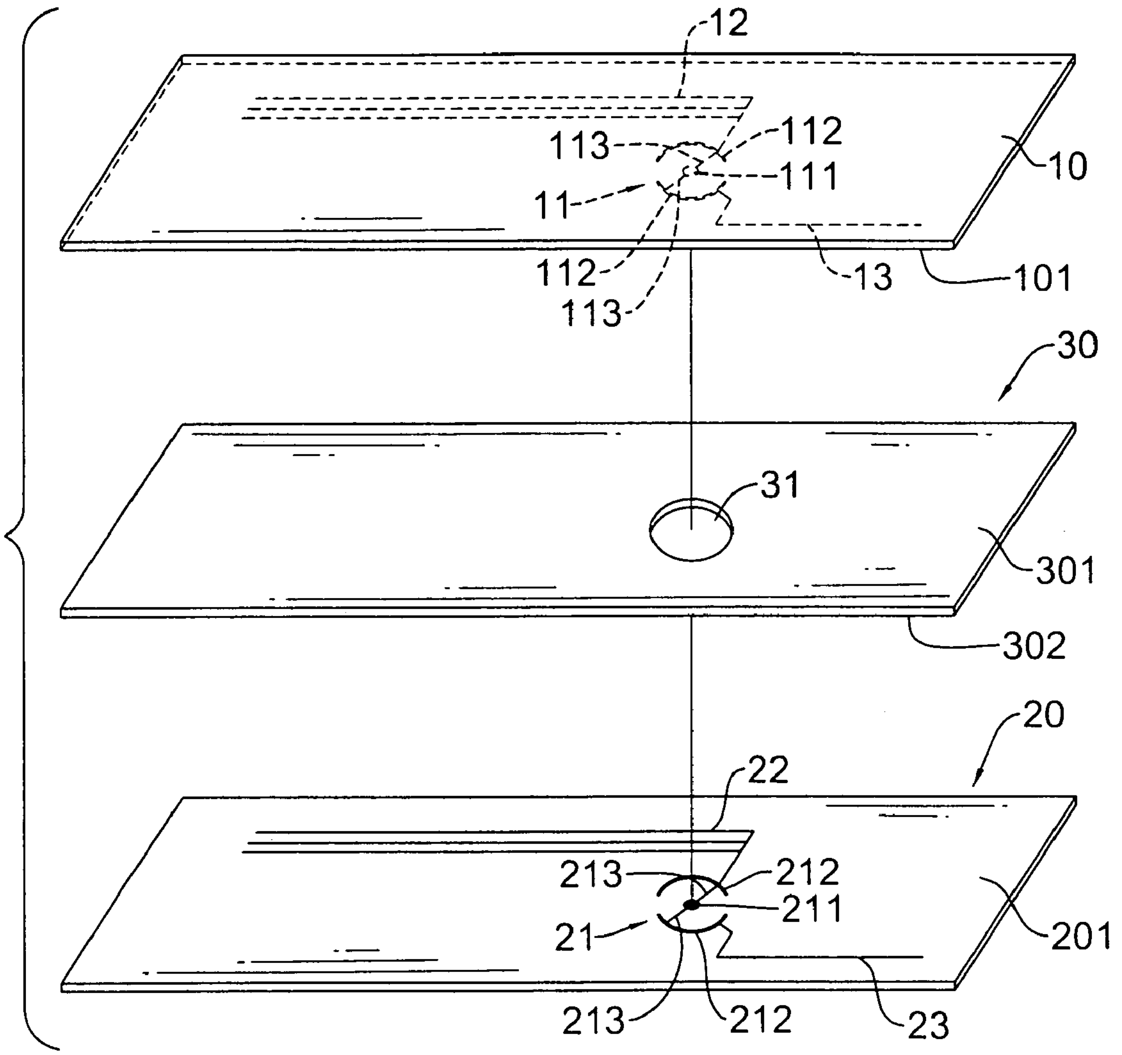
FIG. 1 is an exploded perspective view of a printed circuit board with a thin film switch in according with the present invention.
Figure 2:
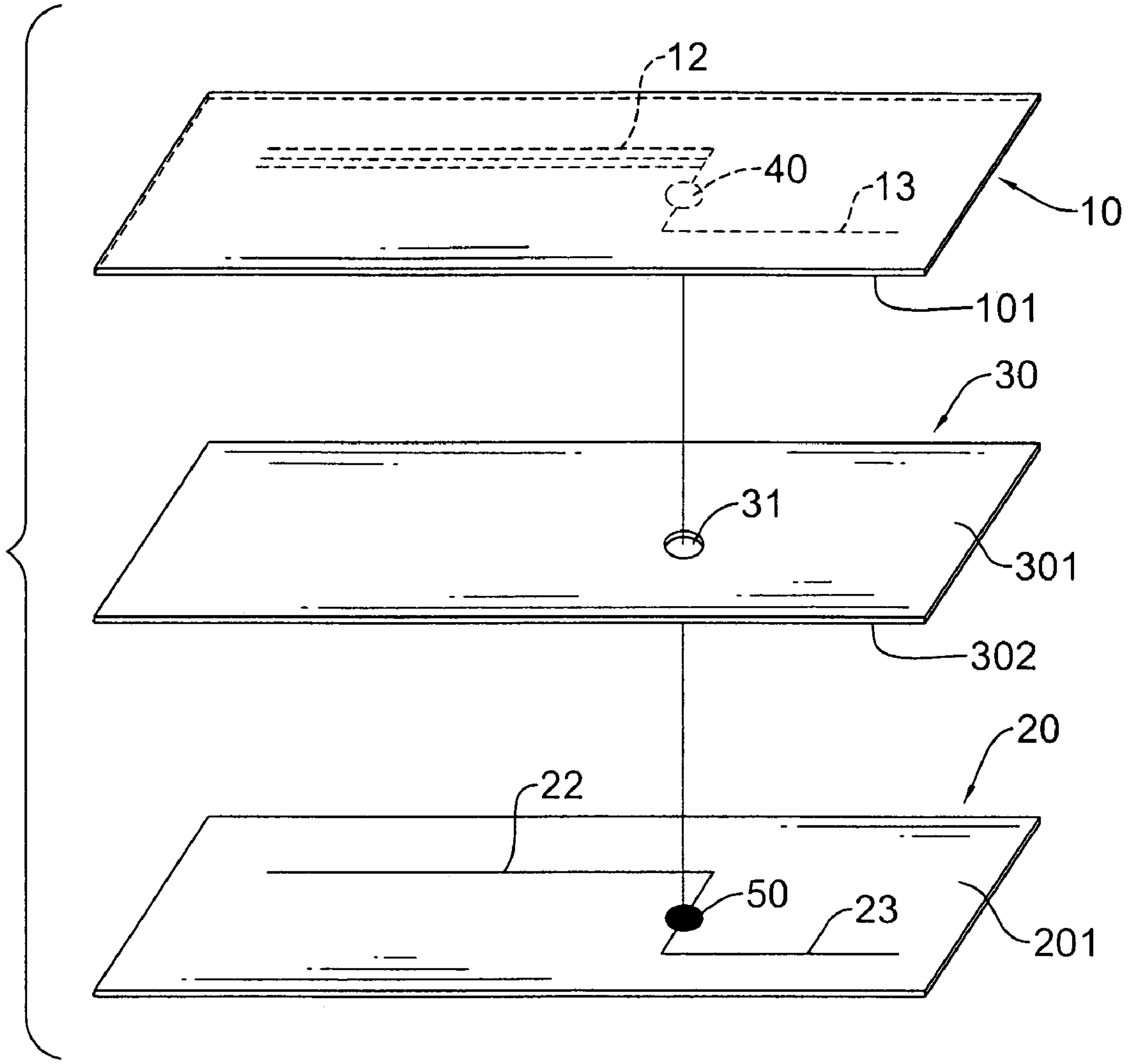
FIG.2 PRIOR ART
FIG. 2 is an exploded perspective view of a conventional printed circuit board for a keyboard in according with the prior art.

With reference to FIG. 1, a printed circuit board for a keyboard in accordance with the present invention has an upper board (10), an insulating separation (30), a lower board (20) and multiple thin film switches. To simplify the drawings, only one thin film switch is shown in the drawings.

The lower surface (101) of the upper board (10) and the upper surface (201) of the lower board (20), respectively, have multiple circuit lines (12, 13) (22,23). The insulating separation (30) is positioned between the upper and lower boards (10, 20) and defines multiple through holes (31). The upper surface (301) of the insulating separation (30) abuts with the lower surface (101), and the lower surface (302) of the insulating separation (30) abuts with the upper surface (201).

The multiple thin film switches are mounted on the printed circuit board. Each thin film switch corresponds to one of the through holes (31) in the insulating separation (30) and has two thin conductive elements (11,21) respectively formed on the upper and lower board (10, 20). Each thin conductive element (11, 21) has a center conductor (111, 211), at least two outer conductors (112, 212) and at least two conductive lines (113, 213).

The center conductor (111, 211) is aligned with the corresponding through hole (31) in the insulating separation (30).

The at least two outer conductors (112, 212) are symmetrically formed adjacent to the center conductor (111,211) and also aligned with the corresponding through hole (31). Each outer conductor (112, 212) is further connected to the circuit lines (12, 13) (22, 23) on the upper or lower board (10, 20).

The at least two conductive lines (113, 213) are respectively connected to the outer conductors (112, 212) and are connected to the center conductor (111, 211).

The center conductor (111, 211) is formed of a circular shape and each outer conductor (112, 212) is formed of a curved shape. When the conductive lines (113, 213) are connected to the center conductor (111, 211) and the outer conductors (112, 212), the thin film conductive element (11, 21) is formed to an invert-S shape.

Since the center conductor (111, 211) and the outer conductor (112, 212) have smaller areas than that of the conventional thin film conductive element in accordance with the prior art, surfaces of the center and outer conductors (111, 211) (112, 212) are hardly shrunk to an uneven face in curing procedure of fabricating upper or lower board. Therefore, the center and outer conductors (111, 211) (112, 212) have even faces, the touching sensitivity of the thin film switch is stable.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A printed circuit board with thin film switches for a keyboard, comprising:

an upper board having multiple circuit lines;

a lower board having multiple circuit lines;

an insulating separation positioned between the upper and lower boards and defining multiple through holes; and at least one thin film switches, each has two thin film conductive elements formed respectively on the upper and lower boards and connected to the circuit lines, wherein each thin film conductive element comprises:

a center conductor being formed on the corresponding upper or lower board and aligned with one of the through holes in the insulating separation;

at least two outer conductors formed on the corresponding upper or lower board, adjacent and coplanar to and distinct and spaced from the center conductor and aligned with a corresponding through hole, wherein each outer conductor is connected to the corresponding circuit lines of the upper or lower board; and at least two conductive lines being formed on the corresponding upper or lower board, coplanar to the center conductor and the at least two outer conductors and aligned with the corresponding through hole, wherein the at least two conductive lines are connected to the center conductor and respectively to the at least two outer conductors.

2. The printed circuit board as claimed in claim 1, wherein the two outer conductors are symmetrically formed adjacent to the center conductor and are formed in a curved shape.

3. The printed circuit board as claimed in claim 2, wherein each thin film conductive element is formed in an inverted S shape.

* * * * *